(12) United States Patent
Kirby et al.

(10) Patent No.: US 7,314,821 B2
(45) Date of Patent: Jan. 1, 2008

(54) METHOD FOR FABRICATING A SEMICONDUCTOR INTERCONNECT HAVING CONDUCTIVE SPRING CONTACTS

(75) Inventors: Kyle K. Kirby, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/030,772

(22) Filed: Jan. 6, 2005

(65) Prior Publication Data

US 2005/0146047 A1    Jul. 7, 2005

Related U.S. Application Data

(62) Division of application No. 10/619,650, filed on Jul. 14, 2003, now Pat. No. 7,042,080.

(51) Int. Cl.
*H01L 21/4763* (2006.01)

(52) U.S. Cl. ............. 438/618; 438/598; 438/128; 438/6

(58) Field of Classification Search ........... 438/624, 438/17, 107, 117, 618, 579, 128, 6; 324/765, 324/754, 757; 257/773
See application file for complete search history.

(56) References Cited

U.S. PATENT DOCUMENTS

| | | | |
|---|---|---|---|
| 5,071,518 A | 12/1991 | Pan | |
| 5,326,428 A | 7/1994 | Farnworth et al. | |
| 5,408,190 A | 4/1995 | Wood et al. | |
| 5,478,779 A | 12/1995 | Akram | |
| 5,483,741 A | 1/1996 | Akram et al. | |
| 5,495,667 A | 3/1996 | Farnworth et al. | |
| 5,519,332 A | 5/1996 | Wood et al. | |
| 5,541,525 A | 7/1996 | Wood et al. | |
| 5,559,444 A | 9/1996 | Farnworth et al. | |
| 5,592,736 A | 1/1997 | Akram et al. | |
| 5,686,317 A | 11/1997 | Akram et al. | |
| 5,716,218 A | 2/1998 | Farnworth et al. | |

(Continued)

OTHER PUBLICATIONS

U.S. Appl. No. 09/259,143, filed Feb. 26, 1999.

(Continued)

*Primary Examiner*—Steven Loke
*Assistant Examiner*—Tram H Nguyen
(74) *Attorney, Agent, or Firm*—Stephen A. Gratton

(57) ABSTRACT

An interconnect for testing a semiconductor component includes a substrate, and interconnect contacts on the substrate configured to electrically engage component contacts on a semiconductor component. Each interconnect contact includes a compliant conductive layer formed as a conductive spring element. In addition, the complaint conductive layer includes a tip for engaging the component contact and a spring segment portion for resiliently supporting the tip. A method for fabricating the interconnect includes the steps of shaping the substrate, forming a conductive layer on a shaped portion of the substrate and removing at least some of the shaped portion. The shaped portion can comprise a raised step or dome, or a shaped recess in the substrate. The conductive layer can comprise a metal, a conductive polymer or a polymer tape can include a penetrating structure or penetrating particles. The interconnect can be used to construct wafer level test systems, and die level test systems as well, for semiconductor components such as wafers, dice and packages.

15 Claims, 8 Drawing Sheets

U.S. PATENT DOCUMENTS

| | | |
|---|---|---|
| 5,756,370 A | 5/1998 | Farnworth et al. |
| 5,781,022 A | 7/1998 | Wood et al. |
| 5,783,461 A | 7/1998 | Hembree |
| 5,815,000 A | 9/1998 | Farnworth et al. |
| 6,005,288 A | 12/1999 | Farnworth et al. |
| 6,068,669 A | 5/2000 | Farnworth et al. |
| 6,072,321 A * | 6/2000 | Akram et al. ............... 324/754 |
| 6,083,822 A * | 7/2000 | Lee ............................ 438/624 |
| 6,232,243 B1 | 5/2001 | Farnworth et al. |
| 6,256,245 B1 * | 7/2001 | Kwak ........................ 365/203 |
| 6,259,036 B1 | 7/2001 | Farnworth et al. |
| 6,265,245 B1 * | 7/2001 | Farnworth et al. .......... 438/107 |
| 6,275,052 B1 | 8/2001 | Hembree et al. |
| 6,285,204 B1 | 9/2001 | Farnworth |
| 6,310,484 B1 | 10/2001 | Akram et al. |
| 6,400,172 B1 | 6/2002 | Akram et al. |
| 6,437,591 B1 | 8/2002 | Farnworth et al. |
| 6,524,346 B1 | 2/2003 | Farnworth |
| 6,544,902 B1 | 4/2003 | Farnworth |
| 6,624,653 B1 | 9/2003 | Cram |
| 6,708,399 B2 | 3/2004 | Farnworth et al. |
| 6,727,715 B2 | 4/2004 | Cram |
| 6,741,091 B2 | 5/2004 | Cram |
| 6,756,802 B2 | 6/2004 | Cram |
| 6,825,685 B2 | 11/2004 | Cram |
| 6,828,812 B2 | 12/2004 | Farnworth et al. |
| 6,853,210 B1 | 2/2005 | Farnworth et al. |
| 6,995,577 B2 | 2/2006 | Farnworth et al. |
| 7,042,080 B2 | 5/2006 | Kirby et al. |
| 7,043,831 B1 | 5/2006 | Farnworth et al. |
| 7,053,641 B2 | 5/2006 | Kirby |
| 7,078,922 B2 | 7/2006 | Kirby |
| 2001/0011907 A1 * | 8/2001 | Farnworth et al. .......... 324/765 |

OTHER PUBLICATIONS

U.S. Appl. No. 09/652,340, filed Aug. 31, 2000.
U.S. Appl. No. 60/425,567, filed Nov. 11, 2002.

* cited by examiner

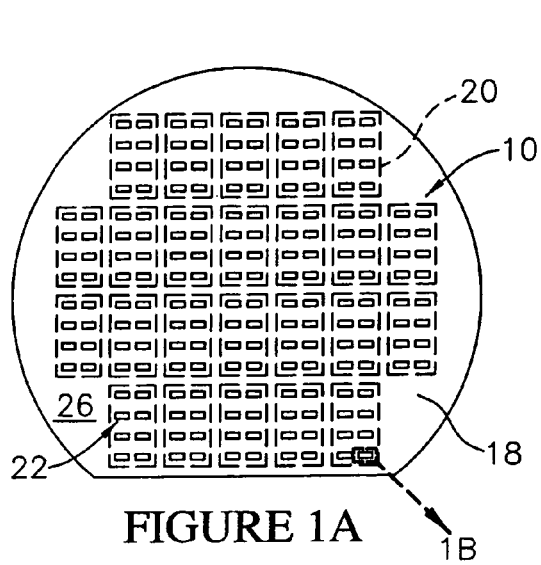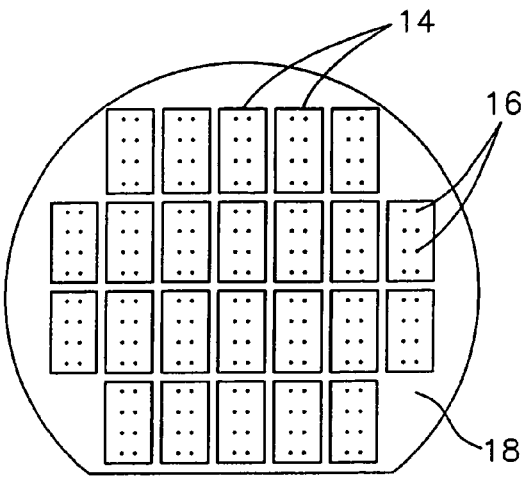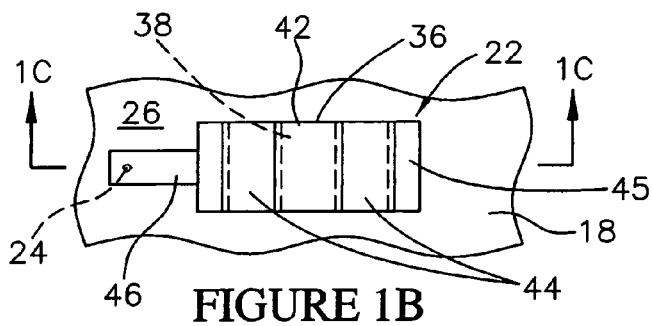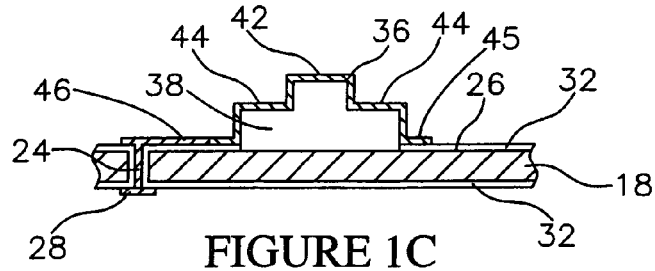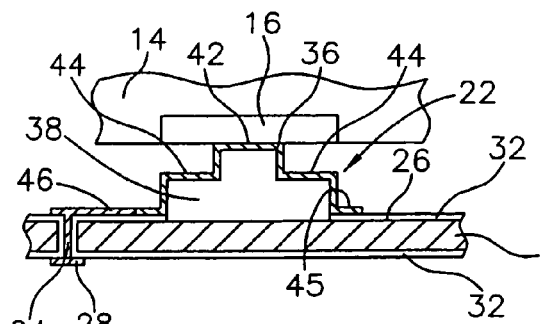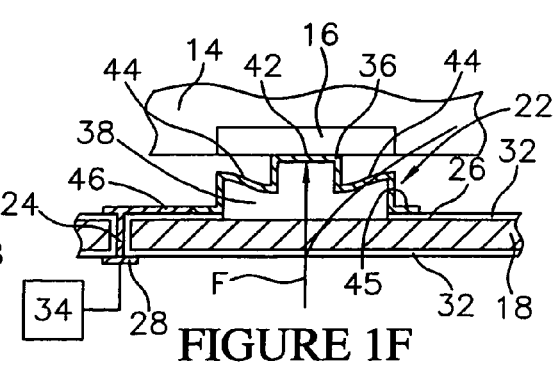

METHOD FOR FABRICATING A SEMICONDUCTOR INTERCONNECT HAVING CONDUCTIVE SPRING CONTACTS

CROSS REFERENCE TO RELATED APPLICATIONS

This application is a division of Ser. No. 10/619,650, filed on Jul. 14, 2003, U.S. Pat. No. 7,042,080.

This application is related to Ser. No. 11/031,160, filed on Jan. 6, 2005, to Ser. No. 11/348,094 filed on Feb. 6, 2006, to Ser. No. 11/347,930 filed on Feb. 6, 2006, and to Ser. No. 11/366,073 filed on Mar. 2, 2006.

FIELD OF THE INVENTION

This invention relates generally to semiconductor manufracture and testing. More particularly, this invention relates to an interconnect for electrically engaging semiconductor components, to a method for fabricating the iterconnect and to test systems incorporating the interconnect.

BACKGROUND OF THE INVENTION

During the fabrication process semiconductor components are tested to evaluate electrical characteristics of the components, and particularly the integrated circuits contained on the components. For example, semiconductor dice and semiconductor packages on a wafer are probe tested on the wafer, and can also be burn-in tested and parametric tested following singulation from the wafer. For performing the tests, an interconnect having interconnect contacts is used to make temporary electrical connections with component contacts on the components. Test signals are then transmitted through the interconnect contacts and the component contacts, to the integrated circuits.

The interconnect contacts preferably have a flexibility or compliancy, which compensates for variations in the size, location and planarity of the component contacts. Probe needles and "POGO PINS" are two types of compliant interconnect contacts designed to make reliable electrical connections, even with variations in the component contacts.

As component contacts become denser and more closely spaced, it becomes even more difficult to make the temporary electrical connections with the component contacts. It also becomes more difficult to fabricate the interconnect contacts with the required size and spacing. Further, interconnect contacts tend to wear with continued usage, which also makes the temporary electrical connections more difficult to make.

The present invention is directed to an interconnect having compliant interconnect contacts able to make reliable electrical connections with small closely spaced component contacts. In addition, the present invention is directed to a fabrication method for the interconnect, and to test systems incorporating the interconnect.

SUMMARY OF THE INVENTION

In accordance with the present invention, improved interconnects for semiconductor components, methods for fabricating the interconnects and test systems incorporating the interconnects are provided.

The interconnect includes a substrate and a plurality of interconnect contacts on the substrate configured to electrically engage component contacts on a semiconductor component. Each interconnect contact includes a compliant conductive layer on the substrate and a conductor in electrical communication with the compliant conductive layer.

The compliant conductive layer can be comprised of a metal, a conductive polymer or a polymer tape. The complaint conductive layer includes a base portion on the substrate, a tip portion configured to contact a component contact, and a spring segment portion configured to support the tip portion for axial movement. The tip portion can also include one or more penetrating structures, such as blades, points, or particles, configured to penetrate the component contact. In addition, the base portion of the compliant conductive layer can be contained in an opening in the substrate.

A method for fabricating the interconnect includes the steps of shaping the substrate, forming a compliant conductive layer on a shaped portion of the substrate, and removing at least some of the shaped portion. The shaped portion of the substrate can comprise a raised step, a dome shape, or a shaped opening in the substrate.

A wafer level test system includes test circuitry, a wafer prober, and a wafer sized interconnect mounted to the wafer prober in electrical communication with the test circuitry. A die level test system includes test circuitry, a test carrier configured to retain discrete semiconductor components, such as bare dice and packages, and a die sized interconnect mounted to the test carrier in electrical communication with the test circuitry.

BRIEF DESCRIPTION OF THE DRAWINGS

All of the drawing Figures, particularly the cross sectional views, are schematic, such that the elements contained therein are not to scale.

FIG. 1A is a schematic plan view of a wafer level interconnect constructed in accordance with the invention;

FIG. 1B is an enlarged schematic plan view taken along line 1B of FIG. 1A illustrating an interconnect contact on the interconnect;

FIG. 1C is an enlarged schematic cross sectional view of the interconnect contact taken along line 1C-1C of FIG. 1B;

FIG. 1D is a schematic plan view of a semiconductor wafer;

FIG. 1E is an enlarged schematic cross sectional view illustrating the interconnect contact electrically engaging a component contact;

FIG. 1F is an enlarged schematic cross sectional view illustrating the interconnect contact flexing during electrical engagement of the component contact;

DETAILED DESCRIPTION OF THE PREFERRED EMBODIMENT

Figure 1G:
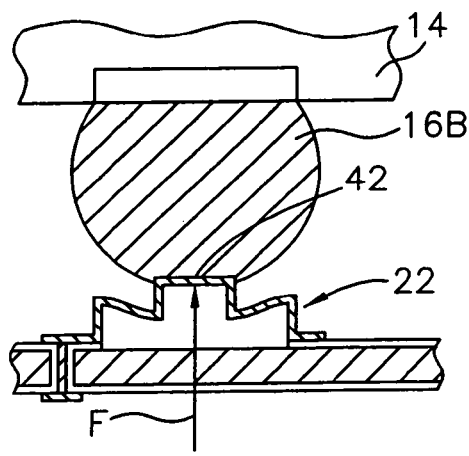
FIG. 1G is an enlarged schematic cross sectional view illustrating the interconnect contact electrically engaging a bumped component contact.

As used herein, the term "semiconductor component" refers to an electronic component that includes a semiconductor die. Exemplary semiconductor components include semiconductor wafers, semiconductor dice, semiconductor packages, and BGA devices.

Referring to FIGS. 1A-1F, a wafer level interconnect 10 constructed in accordance with the invention is illustrated. The interconnect 10 is configured to test a semiconductor wafer 12 (FIG. 1D) containing a plurality of semiconductor components 14 (FIG. 1D), such as dice or packages. Each component 14 includes a plurality of component contacts 16 such as bond pads, redistribution pads, test pads or terminal contacts in electrical communication with the integrated circuits contained on the components 14.

In the illustrative embodiment, the interconnect 10 is configured to electrically engage all of the component contacts 16 on the components 14 on the wafer 12 at the same time. However, the interconnect 10 can also be configured to electrically engage one component 14 on the wafer 12 at a time, or clusters of two or more components 14 on the wafer 12 at a time. The interconnect 10 can also be configured to test other wafer sized components, such as leadframes, strips, or panels containing multiple semiconductor components. Further, as will be further explained, a die level interconnect 10D (FIG. 11A) can be configured to test singulated components 14, such as dice or packages.

As shown in FIG. 1A, the interconnect 10 includes a substrate 18, and a plurality of patterns 20 of interconnect contacts 22 on the substrate 18. In FIG. 1A, each pattern 20 of interconnect contacts 22 is denoted by dotted lines having outlines corresponding to the outlines of the components 14 on the wafer 12. In addition, the interconnect contacts 22 are located on a first side 26 (face) of the substrate 18.

The substrate 18 can comprise a semiconductor material, such as silicon, germanium or gallium arsenide. Alternately, the substrate 18 can comprise another machineable or etchable material, such as ceramic or plastic. With a semiconductor material, the substrate 18 also includes electrically insulating layers 32, such as polymer or oxide layers, which electrically insulate the bulk of the substrate 18 from the interconnect contacts 22, and other electrical elements of the interconnect 10 as well. However, if the substrate 18 comprises an electrically insulating material, such as plastic or ceramic, the insulating layers 32 are not required.

The interconnect 10 can also include a plurality of conductors 46 and conductive vias 24 (FIG. 1C) in electrical communication with the interconnect contacts 22. In addition, the interconnect 10 can include a plurality of terminal contacts 28 on a second side 30 (back side) of the substrate 18 in electrical communication with the conductive vias 24. As will be further explained, the terminal contacts 28 provide electrical connection points from test circuitry 34 (FIG. 1F) configured to apply test signals through the interconnect 10 to the components 14.

As shown in FIGS. 1B and 1C, each interconnect contact 22 includes a compliant conductive layer 36 on the substrate 18 in electrical communication with a conductor 46 and a conductive via 24. In addition, the compliant conductive layer 36 for each interconnect contact 22 has an elevated topography relative to the planar first side 26 of the substrate 18 and a generally rectangular shaped outline. In addition, the compliant conductive layer 36 for each interconnect contact 22 has a stepped shape and a hollow interior portion 38 open on opposed longitudinal sides. Further, the compliant conductive layer 36 for each interconnect contact 22 includes a base portion 45 on the substrate 18, a tip portion 42 configured to electrically engage a component contact 16 (FIG. 1E), and an opposed pair of shaped spring segment portions 44 configured to allow z-direction movement, or flexure, of the tip portion 42 during electrical engagement of the component contact 16.

The flexibility of the compliant conductive layer 36 allows the interconnect contacts 22 to accommodate variations in the planarity of the component contacts 16. For example, some component contacts 16 may be contained in an offset plane relative to the other component contacts 16 on a component 14. In this case, the compliant conductive layers 36 on the interconnect contacts 22 can move independently of one another, such that reliable electrical connections can be made, even with the variations in the planarity of one or more of the component contacts 16.

Further, the compliant conductive layer 36 is configured to maintain its shape with continued usage, and to exert a contact force F (FIG. 1F) during electrical engagement of the component contacts 16. The compliant conductive layer 36 can comprise a highly conductive metal such as Ti, Cu, Al, W, Mo, Ta, Be, Mg and alloys of these metals, such as BeCu. The compliant conductive layer 36 can also comprise a conductive polymer, such as a silver filled silicone, provided the polymer is formulated to return to its original shape following deformation.

As shown in FIG. 1E, the tip portions 42 of the interconnect contacts 22 are configured to physically and electrically engage the component contacts 16, as the interconnect 10 is pressed against the wafer 12 by a test apparatus. In addition, as shown in FIG. 1F, the tip portions 42 are configured to move in the z-direction as the interconnect 10 is overdriven into the wafer 12 by the test apparatus. As also shown in FIG. 1F, the spring segment portions 44 are configured to flex during movement of the tip portions 42.

The interconnect contacts 22 are configured to electrically engage small closely spaced component contacts 16, such as inner lead bonds (ILB), having a spacing of about 100 μm or smaller. In addition, the interconnect contacts 22 are configured to electrically engage either planar component contacts or bumped component contacts. For example, in FIG. 1F, the interconnect contact 22 is shown electrically engaging a planar component contact 16. In FIG. 1G, the interconnect contact 22 is shown electrically engaging a bumped component contact 22B, such as a terminal contact, or an outer lead bond (OLB) on the component 14.

In addition, the tip portions 42 of the compliant conductive layers 36 can be sized to penetrate the component contacts 16 but without substantially distorting the component contacts 16. By way of example, a width of the tip portions 42 can be from 10 μm to 50 μm. In addition, although the tip portions 42 are shown as having planar surfaces, the tip portions 42 can also have pointed or conical surfaces.

Figure 1H:
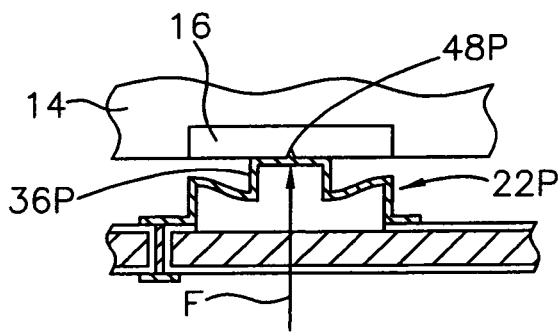
FIG. 1H is an enlarged schematic cross sectional view illustrating an alternate embodiment interconnect contact with a penetrating structure.

As shown in FIG. 1H, an alternate embodiment interconnect contact 22P is substantially similar in construction to the interconnect contact 22 (FIG. 1C), but includes a compliant conductive layer 36P having one or more penetrating structures 48P, such as points or blades, configured to penetrate the component contacts 16 to a limited penetration depth.

Figure 1I:
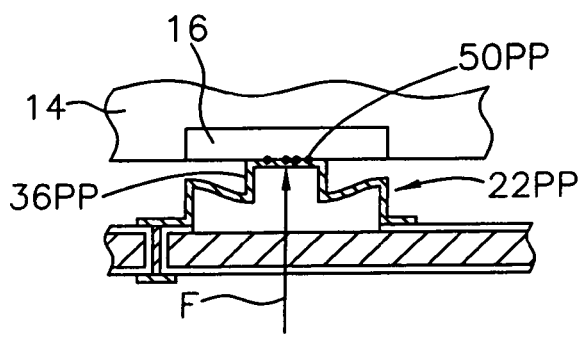
FIG. 1I is an enlarged schematic cross sectional view illustrating an alternate embodiment interconnect contact with penetrating particles.

As shown in FIG. 1I, an alternate embodiment interconnect contact 22PP is substantially similar in construction to the interconnect contact 22 (FIG. 1C), but includes a compliant conductive layer 36PP having penetrating particles 50PP such as diamond, synthetic diamond, cubic boron nitride, or carbon particles, configured to penetrate the component contacts 16. U.S. Pat. No. 6,285,204B1 to Farnworth, entitled "Method For Testing Semiconductor Packages Using Oxide Penetrating Test Contacts", which is incorporated herein by reference, describes contacts formed with penetrating particles.

Figure 2A:
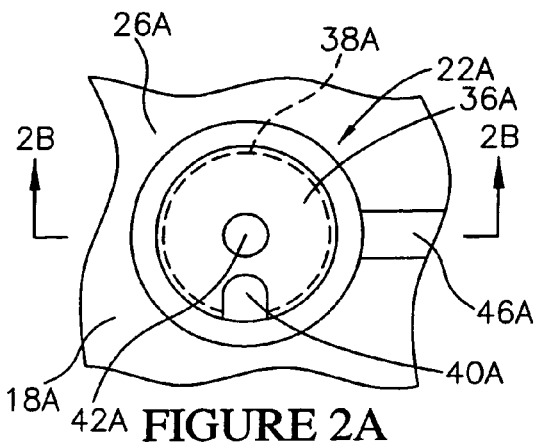
FIG. 2A is an enlarged schematic plan view equivalent to FIG. 1B illustrating an alternate embodiment interconnect contact having a dome shape.
Figure 2C:
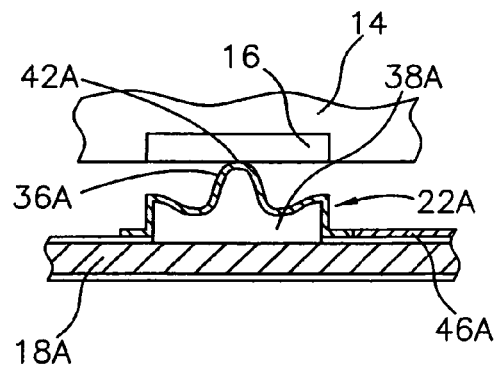
FIG. 2C is an enlarged schematic cross sectional view illustrating the alternate embodiment interconnect contact electrically engaging a component contact.
Figure 2B:
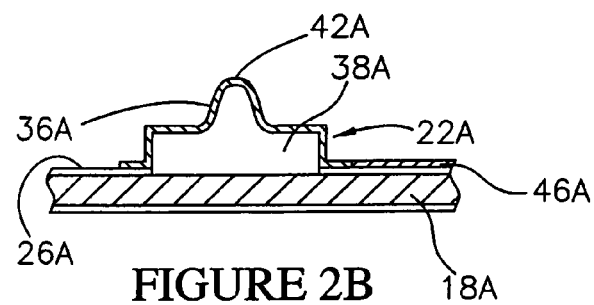
FIG. 2B is an enlarged schematic cross sectional view of the alternate embodiment interconnect contact taken along line 2B-2B of FIG. 2A.

Referring to FIGS. 2A-2C, an alternate embodiment interconnect contact 22A is illustrated. The interconnect contact 22A is substantially similar in construction to the interconnect contact 22 (FIG. 1C), but is circular when viewed from above, rather than rectangular. In addition, the interconnect contact 22A is generally dome shaped, and has an enclosed interior portion 38A.

The interconnect contact 22A includes a compliant conductive layer 36A having a tip portion 42A configured to physically and electrically engage the component contact 16 on the component 14. In this embodiment there are no separate spring segment portions 44 (FIG. 1C) as the dome shape of the compliant conductive layer 36A provides the spring force for the tip portion 42A. In addition, the compliant conductive layer 36A includes an opening 40A, which as will be further explained, provides access for forming the enclosed interior portion 38A.

The interconnect contact 22A is formed on a substrate 18A, and includes conductors 46A on a first side 26A of the substrate 18A in electrical communication with the compliant conductive layer 36A. The conductors 46A can also be in electrical communication with edge contacts (not shown) on the first side 26A of the substrate 18A, which serve the same function as the terminal contacts 28 (FIG. 1C).

As shown in FIG. 2C, the compliant conductive layer 36A deforms under a biasing force applied by a test apparatus, such that the tip portion 42A exerts a contact force on the component contact 16. In addition, the tip portion 42A can move in the z-direction, to accommodate variations in the planarity of the component contacts 16, substantially as previously described.

Figure 3A:
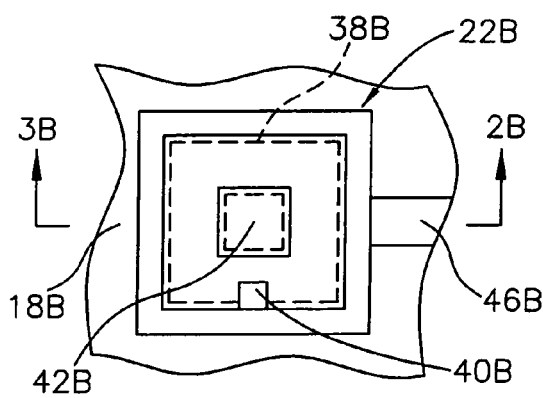
FIG. 3A is an enlarged schematic plan view equivalent to FIG. 1B illustrating an alternate embodiment interconnect contact having an enclosed square shape.
Figure 3C:
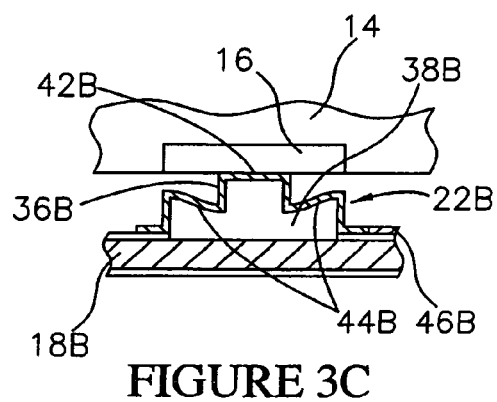
FIG. 3C is an enlarged schematic cross sectional view illustrating the alternate embodiment interconnect contact electrically engaging a component contact.
Figure 3B:
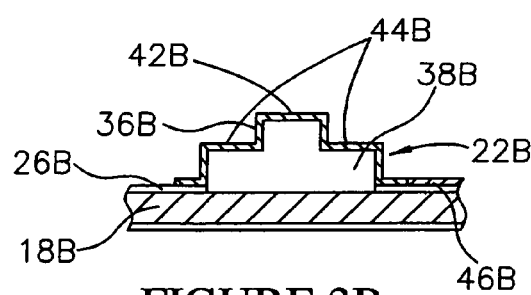
FIG. 3B is an enlarged schematic cross sectional view of the alternate embodiment interconnect contact taken along line 3B-3B of FIG. 3A.

Referring to FIGS. 3A-3C, an alternate embodiment interconnect contact 22B is illustrated. The interconnect contact 22B is substantially similar in construction to the interconnect contact 22 (FIG. 1C), but is square when viewed from above, rather than rectangular. In addition, the interconnect contact 22B has an enclosed interior portion 38B and four spring segment portions 44B located along the four sides of the square shape. The interconnect contact 22B includes a compliant conductive layer 36B having a tip portion 42B configured to physically and electrically engage the component contact 16 on the component 14. The compliant conductive layer 36B also includes an opening 40B, which as will be further explained, provides access for forming the enclosed interior portion 38B.

The interconnect contact 22B is formed on a substrate 18B and includes conductors 46B on a first side 26B of the substrate 18B in electrical communication with the compliant conductive layer 36B. The conductors 46B can also be in electrical communication with edge contacts (not shown) on the substrate 18B, which serve the same function as the terminal contacts 28 (FIG. 1E).

As shown in FIG. 3C, the compliant conductive layer 36B deforms under a biasing force applied by a test apparatus, such that the tip portion 42B exerts a contact force on the component contact 16. In addition, the tip portion 42B can move in the z-direction to accommodate variations in the planarity of the component contacts 16, substantially as previously described.

Figure 4:
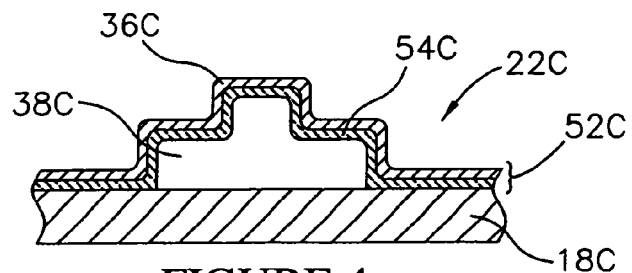
FIG. 4 is an enlarged schematic cross sectional view equivalent to FIG. 1C of an alternate embodiment interconnect contact having a polymer tape.

Referring to FIG. 4, an alternate embodiment interconnect contact 22C is substantially similar to the interconnect contact 22 (FIG. 1C) previously described. However, the interconnect contact 22C includes a polymer tape 52C, which comprises a polymer substrate 54C and a compliant conductive layer 36C on the polymer substrate 54C. The polymer tape 52C is similar to a multilayered TAB tape, such as "ASMAT" manufactured by Nitto Denko of Japan. The interconnect contact 22C also includes a hollow interior portion 38C substantially as previously described.

Referring to FIGS. 5A-5D, an alternate embodiment interconnect contact 22D is illustrated. The interconnect contact 22D includes a compliant conductive layer 36D having a tip portion 42D configured to physically and electrically engage the component contact 16 on the component 14. The compliant conductive layer 36B also includes spring segment portions 44D formed in an opening 56D in a substrate 18D. The compliant conductive layer 36B also includes conductive base portions 60D which line the opening 56D in the substrate 18D.

The interconnect contact 22D also includes conductors 46D on a second side 30D of the substrate 18D in electrical communication with the compliant conductive layer 36D. The interconnect contact 22D also includes a terminal contact 28D on the second side 30D in electrical communication with the conductors 46D. In addition, the interconnect contact 22D includes electrically insulating layers 32D, which electrically insulate the base portions 60D of the compliant conductive layer 36D and the conductors 46D from the substrate 18D. However, if the substrate 18D comprises an electrically insulating material, such as plastic or ceramic, the insulating layers 32D are not required.

Figure 5A:
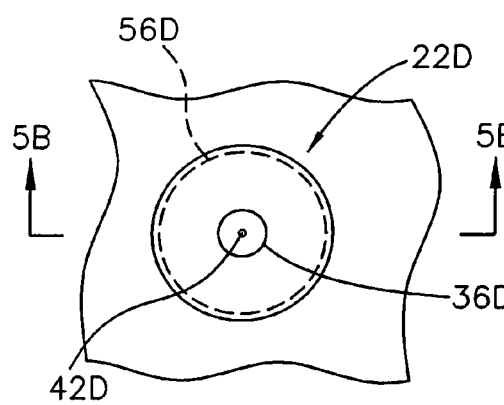
FIG. 5A is an enlarged schematic plan view equivalent to FIG. 1B illustrating an alternate embodiment interconnect contact having an opening in the substrate.
Figure 5C:
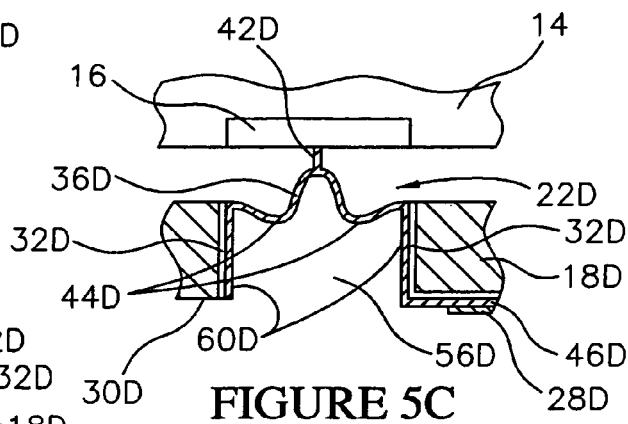
FIGS. 5C and 5D are enlarged schematic cross sectional views illustrating the alternate embodiment interconnect contact electrically engaging a component contact.
Figure 5B:
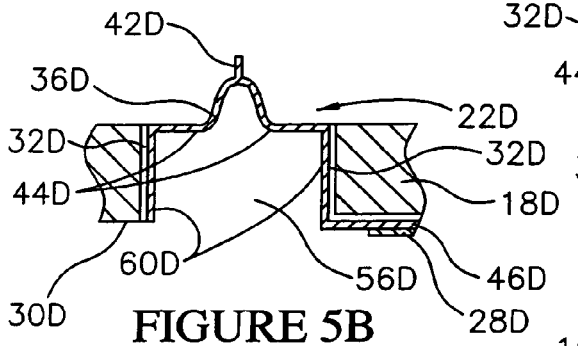
FIG. 5B is an enlarged schematic cross sectional view of the alternate embodiment interconnect contact taken along line 5B-5B of FIG. 5A.

As shown in FIG. 5C, the compliant conductive layer 36D is shaped as a spring configured to deform under a biasing force applied by a test apparatus, such that the tip portion 42D exerts a contact force on the component contact 16. In addition, the tip portion 42D can move in the z-direction to accommodate variations in the planarity of the component contacts 16, substantially as previously described. Further, the spring segment portions 44D and the tip portion 42D can move into the opening 56D, if required, to provide additional z-direction movement.

Figure 5D:
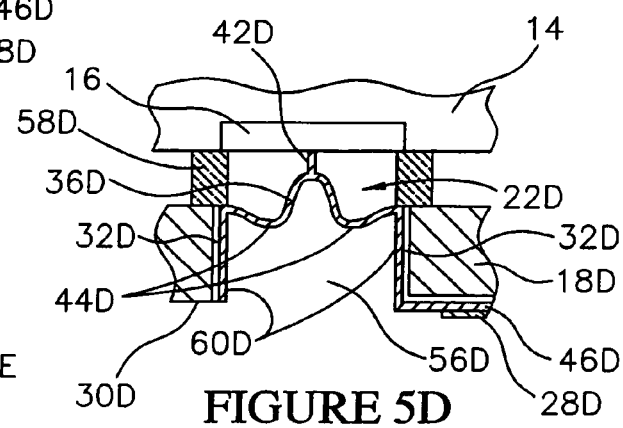

As shown in FIG. 5D, the interconnect contact 22D can also include a polymer stop plane element 58D configured to limit the movement of the spring segment portions 44D and the tip portion 42D. The polymer stop plane element 58D can comprise a donut shaped member formed on a first side 26D of the substrate 18D circumjacent to the compliant conductive layer 36D. In addition, the polymer stop plane element 58D has a thickness selected to allow the tip portion 42D to flex by only a selected amount following engagement with the component contact 16.

Figure 6:
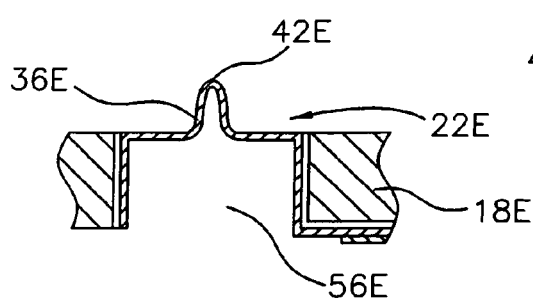
FIG. 6 is an enlarged schematic cross sectional view equivalent to FIG. 1C of an alternate embodiment interconnect contact having an enclosed spring shape.

Referring to FIG. 6, an alternate embodiment interconnect contact 22E is substantially similar to the interconnect contact 22D. The interconnect contact 22E includes a compliant conductive layer 36E formed over an opening 56E in a substrate 18E, substantially as previously described for interconnect contact 22D. In addition, the compliant conductive layer 36E is formed as a closed spring segment with a generally pointed tip portion 42E.

Referring to FIGS. 7A-7H, steps in a method for fabricating the interconnect contact 22 (FIGS. 1A-1F) are illustrated. Essentially the same method can also be used to fabricate the interconnect contact 22P (FIG. 1H), the interconnect contact 22PP (FIG. 1I), the interconnect contact 22A (FIGS. 2A-2C), the interconnect contact 22B (FIGS. 3A-3C), or the interconnect contact 22C (FIG. 4).

Figure 7A:
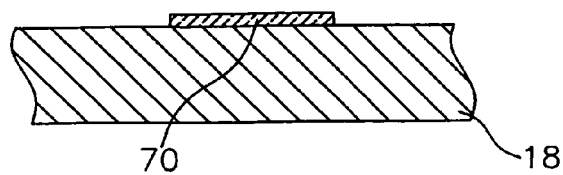
FIGS. 7A-7H are schematic cross sectional views illustrating steps in a method for fabricating the interconnect contact of FIGS. 1A-1F.

Initially, as shown in FIG. 7A, the substrate 18 can be provided. The substrate 18 can be contained on a wafer or panel of material containing a plurality of substrates 18, such that a wafer level fabrication method can be used. In the illustrative embodiment the substrate 18 comprises a semiconductor material, such as silicon, germanium or gallium arsenide. Alternately, the substrate 18 can comprise another machineable or etchable material, such as ceramic or plastic.

As also shown in FIG. 7A, a first etch mask 70 can be formed on the substrate 18. For simplicity, the first etch mask 70 is illustrated as forming a single interconnect contact 22. However, in actual practice the first etch mask 70 can be configured to form multiple interconnect contacts 22 for multiple interconnects 10. The first etch mask 70 can comprise a photoimageable material, such as a negative or positive tone resist, or a hard mask, such as $Si_3N_4$, patterned using a resist. The first etch mask 70 has a peripheral outline which corresponds to the peripheral outline of the spring segment portions 44 of the interconnect contact 22.

Figure 7B:
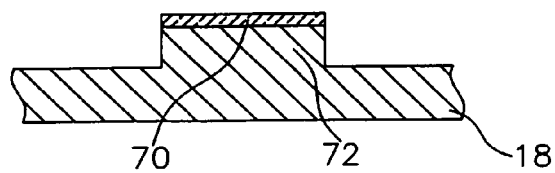

As shown in FIG. 7B, the first etch mask 70 can be used to etch the substrate 18 to form a stepped base 72, and then removed using a suitable stripper. Etching can be performed using a suitable wet etchant for the substrate material, such as KOH, or tetramethylammoniumhydroxide (TMAH), for a silicon substrate. In addition, the etch process can be controlled to form the stepped base 72 with a required height on the substrate 18. In addition to forming the stepped base 72, the etch process also thins the substrate 18 by an amount equal to the height of the stepped base 72.

Figure 7C:
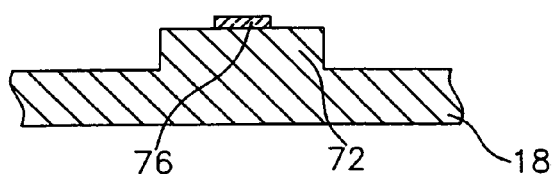

Next, as shown in FIG. 7C, a second etch mask 76 is formed on the stepped base 72, substantially as previously described for first etch mask 70.

Figure 7D:
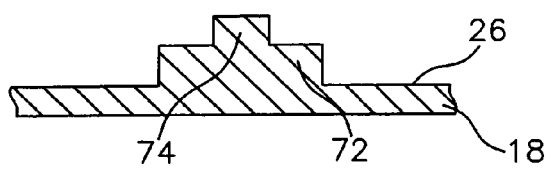

Next, as shown in FIG. 7D, the second etch mask 76 can be used to etch a stepped tip 74 on the stepped base 72, and thin the substrate 18, substantially as previously described for the stepped base 72. Following this etch step the second etch mask 76 can be removed using a suitable stripper.

Figure 7E:
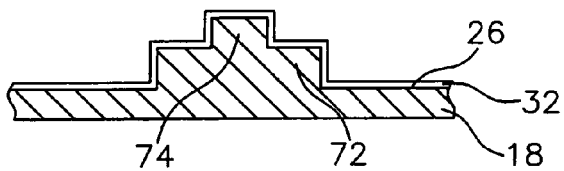

Next, as shown in FIG. 7E, the electrically insulating layer 32 can be formed on the surfaces of the stepped base 72 and the stepped tip 74, and on the first side 26 of the substrate 18. The electrically insulating layer 32 can comprise a deposited polymer, such as polyimide or parylene, or a grown oxide, such as $SiO_2$.

Figure 7F:
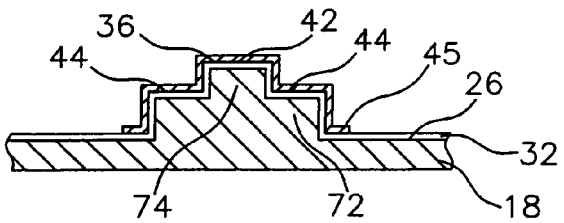
Figure 7G:
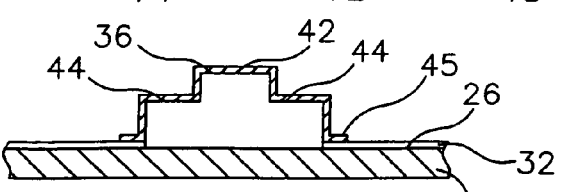

Next, as shown in FIG. 7F, the compliant conductive layer 36 can be formed on the insulating layer 32 such that it covers the stepped tip 74, the stepped base 72, and a portion of the first side 26 of the substrate 18. The compliant conductive layer 36 includes the base portion 45 on the first side 26 of the substrate 18. In addition, the compliant conductive layer 36 can be open on one or more sides, such that access is provided for etching away the stepped tip 74 and the stepped base 72, to form the hollow interior portion 38 (FIG. 7G).

Alternately, the compliant conductive layer 36 can completely enclose the stepped tip 74 and the stepped base 72, and openings 40A (FIG. 2A) or 40B (FIG. 3A) can be formed in the compliant conductive layer 36 for removing the stepped tip 74 and the stepped base 72. In this case an additional etch or laser machining process can be used to form the openings 40A (FIG. 2A) or 40B (FIG. 3A) in the compliant conductive layers 36A (FIG. 2A) or 36B (FIG. 3A).

The compliant conductive layer 36 can be formed by conformally depositing a metal layer on the stepped tip 74, on the stepped base 72, and on portions of the first side 26 of the substrate 18. A suitable deposition process, such as sputtering, CVD, electrolytic deposition, or electroless deposition can be used to deposit the compliant conductive layer 36 with a required thickness and peripheral outline. Suitable metals for the compliant conductive layer 36 include Ti, Cu, Al, W, Mo, Ta, Be, Mg and alloys of these metals.

Alternately, the compliant conductive layer 36PP (FIG. 1I) can comprise a conductive polymer material, such as silver filled silicone, containing penetrating particles 50PP (FIG. 1I), such as dendritic metal or carbon particles. In addition, the conductive polymer can be deposited using a suitable process such as stenciling or screen printing.

As another alternative, the compliant conductive layer 36C (FIG. 4) can comprise a polymer tape 52C (FIG. 4), which is adhesively bonded, or otherwise attached to the stepped tip 74, to the stepped base 72, and to portions of the first side 26 of the substrate 18.

Next, as shown in FIG. 7G, the substrate 18 can be etched, substantially as previously described, to form the hollow interior portion 38. The etch step can also remove portions of the insulating layer 32 on the stepped tip 74 and the stepped base 72. Access for the wet etchant can be through the sides of the compliant conductive layer 36, or alternately through the openings 40A (FIG. 2A) or 40B (FIG. 3A) in the compliant conductive layers 36A (FIG. 2A) or 36B (FIG. 3A). In addition, end pointing of the etch step can be accomplished using techniques that are known in the art.

Figure 7H:
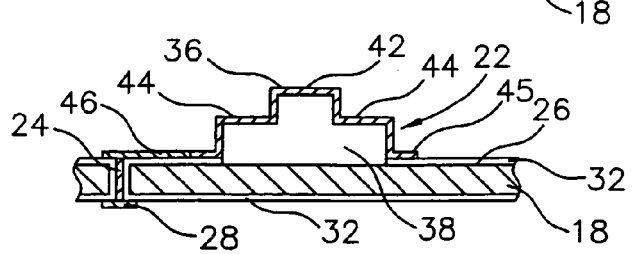

Following the etch step, and as shown in FIG. 7H, conductors 46 can be formed on the first side 26 of the substrate 18 in electrical communication with the compliant conductive layers 36. The conductors 46 can be formed using a subtractive process (e.g., etching a blanket deposited metal layer through a mask), or an additive process (e.g., depositing a metal through openings in a mask. In addition, the conductive vias 24 can be formed in the substrate 18 in electrical communication with the conductors 46. Alternately, the conductive vias 24 can be formed in direct electrical communication with the compliant conductive layer 36.

The conductive vias 24 can be formed by etching, or laser machining openings in the substrate 18, forming the electrically insulating layers 32 in the openings, and then forming a conductive material, such as a metal or a conductive polymer in the openings. One suitable process for forming the conductive vias 24 is described in U.S. Pat. No. 6,400,172 B1 to Akram et al., entitled "Semiconductor Components Having Lasered Machined Conductive Vias", which is incorporated herein by reference.

As also shown in FIG. 7H, the terminal contacts 28 can be formed on the second side 30 of the substrate 18 in electrical communication with the conductive vias 24. As with the conductors 46, the terminal contacts 28 can be formed using a subtractive or an additive process Alternately, rather than conductive vias 24 and terminal contacts 28 on the second side 30, the conductors 46 can be in electrical communication with terminal contacts (not shown) formed on the first side 26 of the substrate 18.

The interconnect contact 22P of FIG. 1H can be formed using essentially the same method outlined in FIGS. 7A-7H but with an additional etch or deposition step to form the compliant conductive layer 36 with penetrating structure 48P (FIG. 1H).

The interconnect contact 22A of FIGS. 2A-2C can be formed using essentially the same method outlined in FIGS. 7A-7H. However, rather than etching the stepped base 72 and the stepped tip 74 in the substrate 18, a bump with a radiused topography can be formed in the substrate 18 using a suitable process, such as isotropic etching. One suitable etchant for isotropically etching silicon comprises a solution of HF, $HNO_3$ and $H_2O$. Access for removing the bump can then be provided by opening 40A in the compliant conductive layer 36A. The interconnect contact 22B of FIGS. 3A-3C can be formed using essentially the same method outlined in FIGS. 7A-7H but by etching through openings 40B (FIG. 3A) in the compliant conductive layer 36B.

Figure 8A:
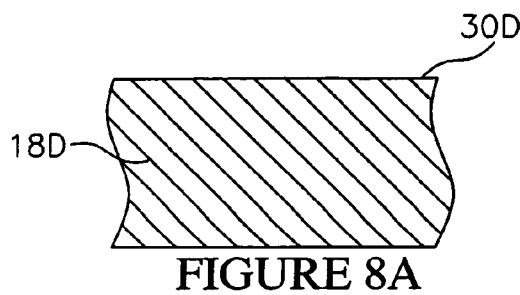
FIGS. 8A-8G are schematic cross sectional views illustrating steps in a method for fabricating the interconnect contact of FIGS. 5A-5D and FIG. 6.

Referring to FIGS. 8A-8G, steps in a method for fabricating the interconnect contact 22D are illustrated. Initially, as shown in FIG. 8A, the substrate 18D can be provided. The substrate 18D includes the second side 18D (backside), and the method includes fabrication steps performed from the second side 18D. As with the previous fabrication method, the substrate 18D can be contained on a wafer or panel of material containing a plurality of substrates 18D, such that a wafer level fabrication method can be used. In the illustrative embodiment the substrate 18D comprises a semiconductor material, such as silicon, germanium or gallium arsenide. Alternately, the substrate 18D can comprise another machineable or etchable material, such as ceramic or plastic.

Figure 8B:
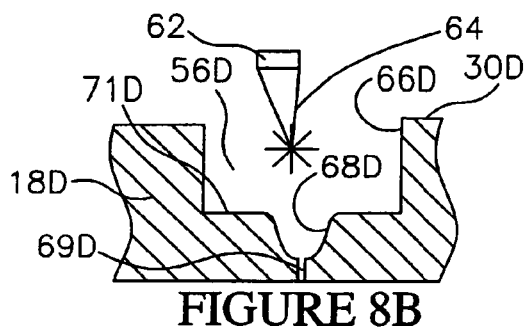

Next, as shown in FIG. 8B, the opening 56D can be formed in the substrate 18D using a subtractive process, such as laser machining or etching. For laser machining, a laser machining apparatus 62 can be used to direct a laser beam 64 at the second side 30D to vaporize selected portions of the substrate 56D and form the opening 56D with a selected size and shape. The opening 56D initially includes a cylindrical portion 66D, a counterbored portion 71D, a conical portion 68D and a tip opening 69D. These elements are sized and shaped to correspond to the desired size and shape of the base portion 60D, the spring segment portions 44D, and the tip portion 42D of the compliant conductive layer 36D. Following the etch step to follow only the cylindrical portion 66D of the opening will remain.

A suitable laser system for performing the laser machining step is manufactured by Electro Scientific, Inc., of Portland, Oreg. and is designated a Model No. 2700. Another laser system is manufactured by XSIL Corporation of Dublin, Ireland and is designated a Model No. "XCISE-200". A representative laser fluence for forming the opening 56D on a silicon substrate having a thickness of about 28 mils (725 µm), is from 2 to 10 watts/per opening at a pulse duration of 20-25 ns, and at a repetition rate of up to several thousand per second. The wavelength of the laser beam can be a standard UV wavelength (e.g., 355 nm).

If desired, following laser machining, an etching step can be performed to remove amorphous polysilicon and crystalline damaged silicon created in a heat affected zone (HAZ) due to heating by the laser beam. One suitable wet etchant is tetramethylammoniumhydroxide (TMAH).

Rather than laser machining, etching techniques can be used to form the opening 56D with the cylindrical portion 66D, the counterbored portion 71D, the conical portion 68D and the tip opening 69D. In this case, one or more etch masks and a wet etchant, such as KOH or TMAH, substantially as described in the previous fabrication method, can be used to etch selected portions of the substrate 18D to form the substrate 18D.

Figure 8C:
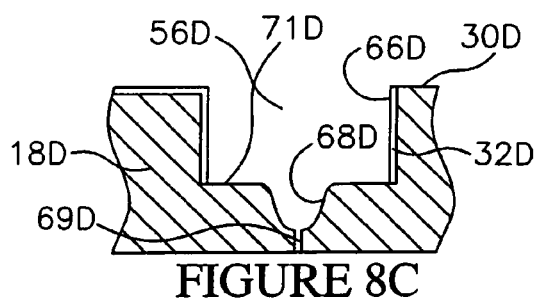

Next, as shown in FIG. 8C, electrically insulating layers 66D are formed on the cylindrical portion 66D of the opening 56D and on the second side 30D of the substrate 18D. The insulating layers 66D can be a grown or a deposited material. For example the insulating layers 66D can comprise a parylene polymer deposited from the vapor phase by a process similar to vacuum metallization at pressures of about 0.1 torr. Suitable polymers include parylene C, parylene N, and parylene D. Parylene is available from Advanced Coating of Tempe, Ariz. One suitable deposition apparatus for depositing parylene polymers is a portable parylene deposition system, designated a model PDS 2010 LABCOATER 2, manufactured by Specialty Coating Systems, of Indianapolis, Ind. A thickness range for the insulating layer 66D can be from 0.10 to 76 µm or greater.

Rather than parylene polymers, the insulating layers 66D can be an oxide, such as $SiO_2$, formed by a growth process by exposure of the base wafer 54 to an $O_2$ atmosphere at an elevated temperature (e.g., 950° C.). Alternately, the insulating layers 66D can comprise an electrically insulating material, such as an oxide or a nitride, deposited using a deposition process such as CVD, or a polymer material deposited using a suitable deposition process such as screen printing.

Figure 8D:
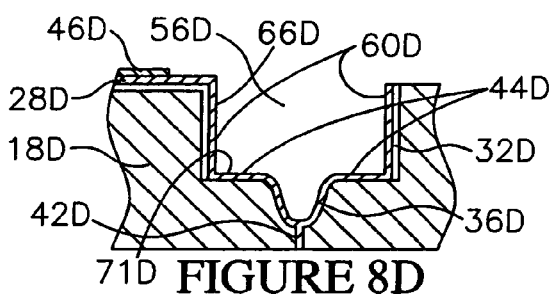

Next, as shown in FIG. 8D, the compliant conductive layer 36D can be formed by forming a conductive material on the cylindrical portion 66D, the counterbored portion 71D, the conical portion 68D and in the tip opening 69D of the opening 56D. The conductive material can comprise a highly conductive metal, such as Ti, Cu, Al, W, Mo, Ta, Be, Mg and alloys of these metals. The above metals can be deposited on the sidewalls of the opening 56D using a deposition process, such as electroless deposition, CVD, or electrolytic deposition. In addition, the conductive material can comprise a single metal or different layers of metal, such as a bonding layer and a non-oxidizing layer.

Rather than being a metal, the conductive material can comprise a conductive polymer, such as a metal filled silicone, or an isotropic epoxy. A suitable deposition process, such as screen printing, or stenciling, can be used to deposit the conductive polymer into the opening 56D. Suitable conductive polymers are available from A.I. Technology, Trenton, N.J.; Sheldahl, Northfield, Minn.; and 3M, St. Paul, Minn. Another suitable conductive polymer is a nanoparticle paste or ink, having metal nano-particles made of a highly conductive metal, such as aluminum. Nano-particle conductive polymers are commercially available from Superior Micropowders, of Albuquerque, N. Mex.

Figure 8E:
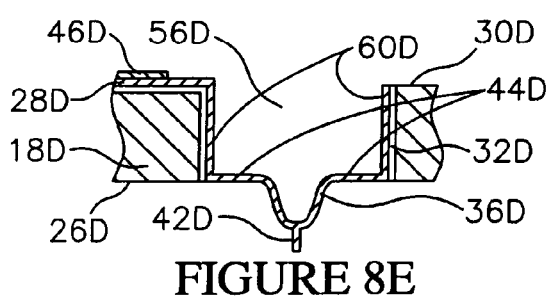

Next, as shown in FIG. 8E, a thinning step is performed to thin the substrate 18D and expose the compliant conductive layer 36D. The thinning step also exposes the first side 26D of the substrate 18D, and removes the counterbored portion 71D, the conical portion 68D and the tip opening 69D of the opening 56D. One method for thinning the substrate 18D is with an etching process using etch masks (if required) and a suitable wet etchant, substantially as previously described. The thinning step can be end pointed on the compliant conductive layer 36D.

Besides wet etching, other suitable processes that can be employed to thin the substrate 18D include downstream plasma etching, micro wave plasma etching and SFG dry etching.

Figure 8F:
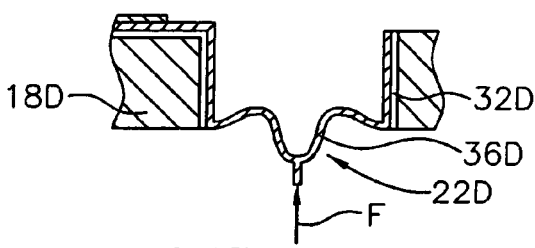

As shown in FIG. 8F, the compliant conductive layer 36D is configured to deflect into the opening 56D in the substrate 18D upon application of a force F to the tip portion 42D, substantially as previously described.

Figure 8G:
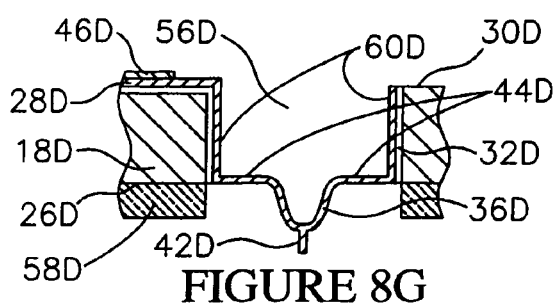

An optional additional step for forming the polymer stop plane element 58D is shown in FIG. 8G. In this case, a polymer layer can be deposited on the first side 26D of the substrate 18D, and an opening 82D formed circumjacent to the compliant conductive layer 36D. The polymer stop plane element 58D can comprise a donut shape element with the opening 82D therein, or a blanket deposited material with the opening 82D therein. In addition, the polymer stop plane element 58D can have a thickness selected such that it functions as a stop plane for limiting movement of the tip portion 42D substantially as previously described.

One method for forming the polymer stop plane element 58D is with a stereo lithographic process. With stereo lithography, the polymer stop plane element 58D can comprise a laser imageable material, such as a "Cibatool SL 5530" resin manufactured by Ciba Specialty Chemicals Corporation, or an "SI40" laser imageable material manufactured by RPC Corporation. To perform the stereo lithographic process, a layer of the laser imageable material can be blanket deposited on the substrate 18 in viscous form using a suitable process such as spin on, and then exposed using a laser beam to define the opening 82D. The layer can then be developed to form the opening 82D in the exposed area. The layer can then be rinsed, cleaned with a cleaning agent such as alcohol, spun to remove excess material, and then cured.

A stereo lithography system for performing the imaging process is available from 3D Systems, Inc. of Valencia, Calif. In addition, stereographic lithographic processes (3-D) are described in U.S. application Ser. No. 09/259,143, to Farnworth et al. filed on Feb. 26, 1999, now U.S. Pat. No. 6,524,346, in U.S. application Ser. No. 09/652,340, to Farnworth et al. filed on Aug. 31, 2000, now U.S. Pat. No. 6,544,902, and in U.S. provisional application Ser. No. 60/425,567, to Farnworth et al. filed on Nov. 11, 2002, all of which are incorporated herein by reference.

As another alternative for forming the polymer stop plane element 58D, a conventional photo tool can be configured to expose a photoimageable material, such as a resist, using electromagnetic radiation in the G, H or I broadband.

The interconnect contact 22E of FIG. 6, can be made using essentially the same process as outlined in FIGS. 8A-8G. However, the tip portion 42E can be made by depositing the conductive material only on the sidewalls of the tip opening 69D (FIG. 8C) of the opening 56D.

Figure 9:
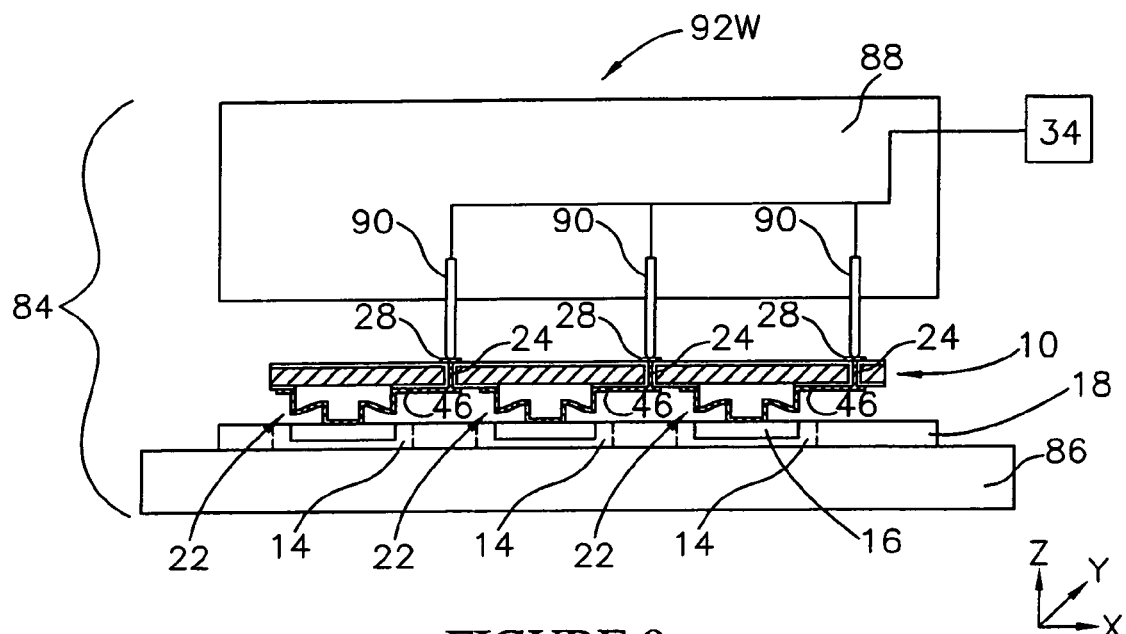
FIG. 9 is a schematic cross sectional view of a wafer level test system incorporating the wafer level interconnect of FIG. 1A.

Referring to FIG. 9, a wafer level testing system 92W incorporating the wafer level interconnect 10, and configured to test the semiconductor wafer 18 is illustrated. In the illustrative embodiment, the interconnect 10 includes the interconnect contacts 22, which as previously described, are configured to make temporary electrical connections with the component contacts 16 on the wafer 18 for applying test signals to the components 14. Alternately, the interconnect 10 can include any of the previously described interconnect contacts 22P, 22PP, 22A, 22B, 22C, 22D, or 22E.

The testing system 92W includes a testing apparatus 84, and the test circuitry 34 in electrical communication with the wafer level interconnect 10. The testing apparatus 84 can comprise a conventional wafer probe handler, or probe tester, modified for use with the interconnect 10. Wafer probe handlers and associated test equipment are commercially available from Electroglass, Advantest, Teradyne, Megatest, Hewlett-Packard and others. In this system 92W, the interconnect 10 takes the place of a conventional probe card, and can be mounted on the testing apparatus 62 using techniques that are known in the art.

For example, the interconnect 10 can mount to a probe card fixture 88 of the testing apparatus 84. The probe card fixture 88 can be similar in construction to a conventional probe card fixture commercially available from manufacturers such as Packard Hughes Interconnect and Wentworth Laboratories. In addition, the testing apparatus 84 can include spring loaded electrical connectors 90 associated with the probe card fixture 88.

The spring loaded electrical connectors 90 are in electrical communication with the test circuitry 34. The test circuitry 34 is adapted to apply test signals to the integrated circuits on the components 14 and to analyze the resultant signals. Test circuitry 34 is commercially available from the above manufacturers as well as others.

The spring loaded electrical connectors 90 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 90 can also comprise wires, pins or cables formed as spring segments or other resilient members.

The spring loaded electrical connectors 90 are configured to electrically contact the terminal contacts 28 on the interconnect 10. This arrangement provides separate electrical paths from the test circuitry 34, through the spring loaded electrical connectors 90, through the terminal contacts 28, through the conductive vias 24, through the conductors 46, and through the interconnect contacts 22 to the component contacts 16. During a test procedure, test signals can be applied to the integrated circuits on the components 14 using these separate electrical paths. Other mounting arrangements for the interconnect 10 are described in U.S. Pat. No. 6,275,052 B1 to Hembree et al., which is incorporated herein by reference.

The testing apparatus 84 also includes a wafer chuck 86 configured to support and move the wafer 18 in X, Y and Z directions as required, such that the interconnect contacts 22 align with, and make physical and electrical contact with all of the component contacts 16 on the wafer 18 at the same time. Test signals can then be selectively applied and electronically switched as required, to selected components 14 and component contacts 16. Alternately, the wafer chuck 86 can be used to step the wafer 18, so that the components 14 can be tested in selected groups, or one at a time.

Figures 10A, 10B:
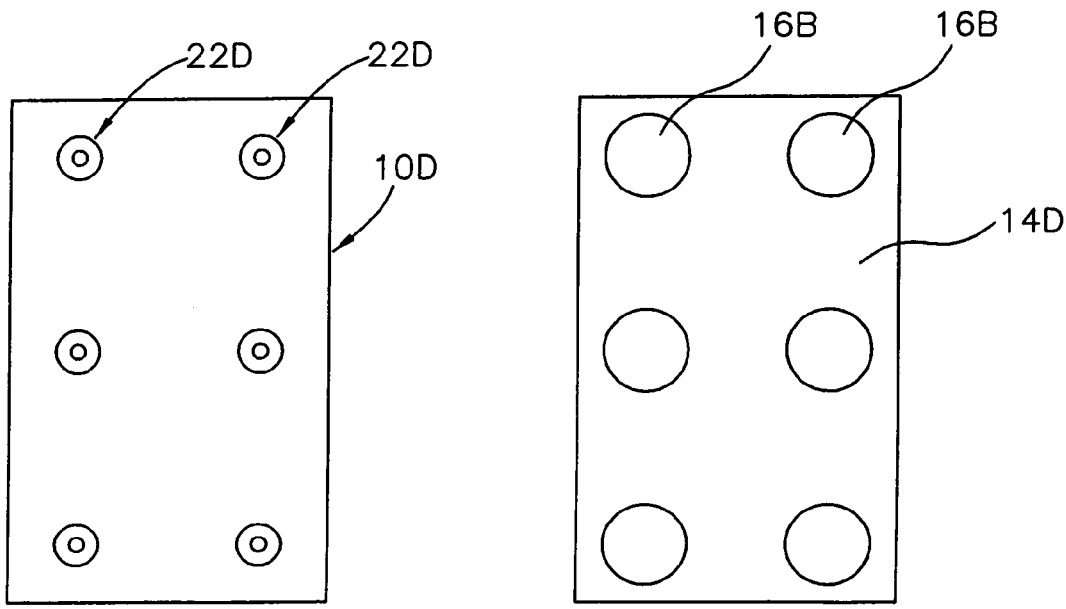
FIG. 10A is an enlarged schematic plan view of a die level interconnect constructed in accordance with the invention.
FIG. 10B is a schematic plan view of a singulated semiconductor component having bumped component contacts.

Referring to FIGS. 10A and 10B, a die level interconnect 10D is illustrated. The interconnect 10D is configured to test singulated semiconductor components 14D (FIG. 10B), such as a semiconductor dice or packages, having bumped component contacts 16B in an area array (e.g., ball grid array). In the illustrative embodiment, the interconnect 10D includes a plurality of interconnect contacts 22D arranged in an area array, which matches the area array of the bumped component contacts 16B. Alternately, the interconnect 10D can include any of the previously described interconnect contacts 22, 22P, 22PP, 22A, 22B, 22C or 22E. Further, the singulated component 14D can include planar component contacts 16, rather than bumped component contacts 16B.

Figure 11A:
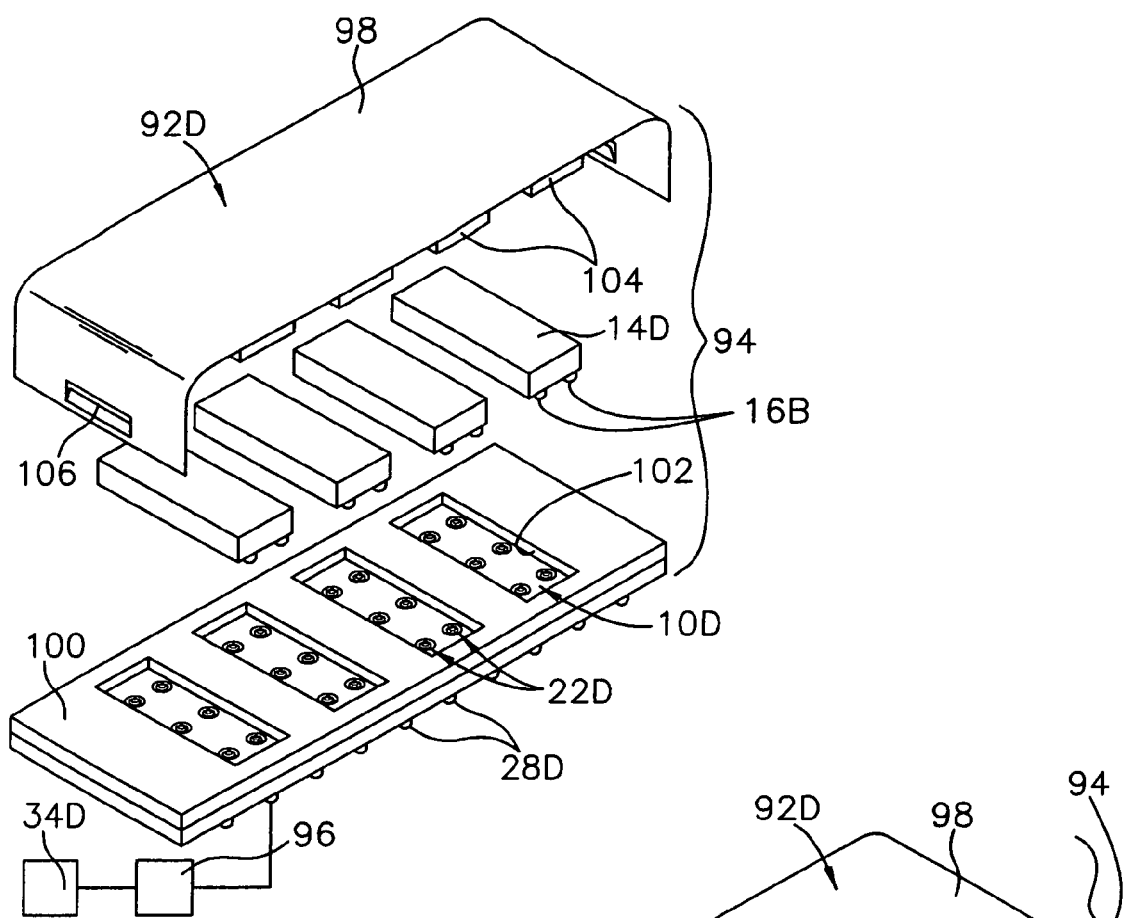
FIG. 11A is a schematic perspective view of a die level test system incorporating the die level interconnect of FIG. 10A.
Figure 11B:
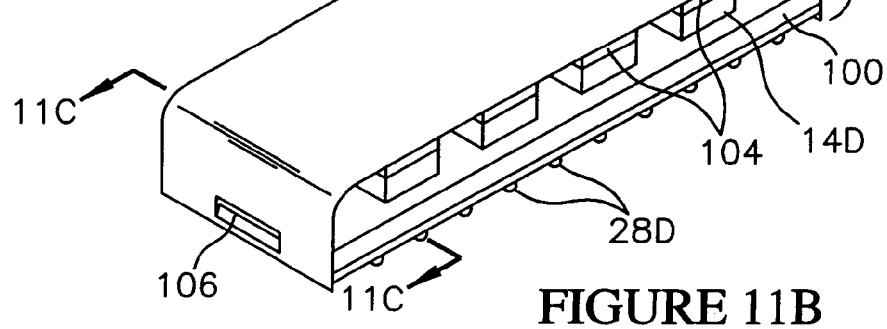
FIG. 11B is a schematic perspective view of a test carrier of the die level test system in a closed position.
Figure 11C:
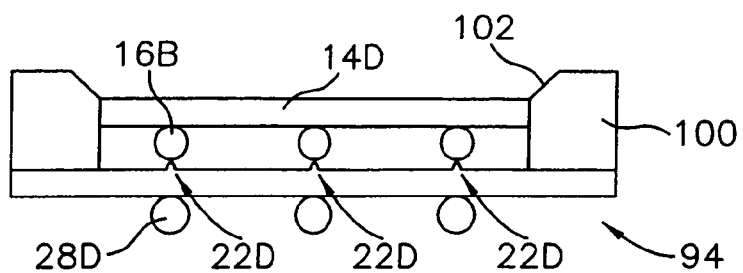
FIG. 11C is a cross sectional view with parts removed taken along section line 11C-11C of FIG. 11B illustrating the die level interconnect of the test system electrically engaging a component.

Referring to FIGS. 11A-11C, a die level test system 92D incorporating the die level interconnect 10D is illustrated. The test system 92D includes a test carrier 94 configured to temporarily package the semiconductor components 14D for test and burn-in. The semiconductor components 14D include the bumped component contacts 16B in electrical communication with the integrated circuits contained on the components 14D.

The test carrier 94 includes four of the die level interconnects 10D, each of which is configured to electrically engage a component 14D. Specifically, the interconnects 10D include interconnect contacts 22D, as previously described, configured to make temporary electrical connections with the bumped component contacts 16B on the components 14D. The interconnects 10D also include bumped terminal contacts 28D configured to electrically engage mating electrical connectors (not shown) on a test apparatus 96 (FIG. 11A), such as a burn-in board.

The test apparatus 96 includes, or is in electrical communication with die level test circuitry 34D (FIG. 11A), configured to apply test signals to the integrated circuits contained on the components 14D, and to analyze the resultant signals. The test circuitry 34D transmits the test signals through the terminal contacts 28D and the interconnect contacts 22D on the interconnects 10D to the bumped component contacts 16B on the components 14D.

The test carrier 94 also includes a force applying mechanism 98 configured to bias the components 14D against the interconnects 10D, and an alignment member 100 configured to align the bumped component contacts 16B on the components 14D, to the interconnect contacts 22D on the interconnects 10D. The alignment member 100 includes openings 102 configured to contact the peripheral edges of the components 14D to guide the components 14D onto the interconnect contacts 22D. The alignment member 100 can be constructed, as described in U.S. Pat. No. 5,559,444, to Farnworth et al. which is incorporated herein by reference. Alternately, the alignment member 100 can be eliminated and optical alignment techniques can be employed to align the components 14D.

As shown in FIGS. 11A and 11B, the force applying mechanism 98 comprises a clamp member which attaches to the interconnects 10D, and a plurality of biasing members 104 for pressing the components 14D against the contacts 22D. In the illustrative embodiment, the biasing members 104 comprise elastomeric blocks formed of a polymer material such as silicone, butyl rubber, flourosilicone, or polyimide. Alternately the biasing members 104 can comprise steel leaf springs. The force applying mechanism 92D includes tabs 106 for engaging the interconnects 10D to secure the force applying mechanism 92D to the interconnects 10D. In the illustrative embodiment, the force applying mechanism 92D attaches directly to the interconnects 10D, which are configured to form a base for the test carrier 94. However, the test carrier 94 can include a separate base, and one or more interconnects 10D can be mounted to the base as described in U.S. Pat. No. 5,519,332 to Wood et al.; U.S. Pat. No. 5,541,525 to Wood et al.; U.S. Pat. No. 5,815,000 to Farnworth et al.; and U.S. Pat. No. 5,783,461 to Hembree, all of which are incorporated herein by reference.

Thus the invention provides an improved interconnect for semiconductor components, methods for fabricating the interconnect and test systems incorporating the interconnect. While the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for a semiconductor component having a component contact comprising: providing a substrate; shaping the substrate to form a shaped portion of the substrate comprising a stepped base having a height on the substrate and a stepped tip on the stepped base; forming a conductive layer on the shaped portion of the substrate having the stepped base and the stepped tip on the stepped base; and following the forming the conductive layer step, removing all of the shaped portion of the substrate to form an elevated compliant conductive layer configured to electrically contact the component contact, the compliant conductive layer including a base portion on the substrate, a tip portion configured to contact the component contact, and a spring segment portion configured to support the tip portion for movement.

2. The method of claim 1 wherein the shaping step comprises etching and thinning the substrate.

3. The method of claim 1 wherein the substrate comprises a semiconductor material and the shaping step comprises etching the semiconductor material.

4. The method of claim 1 further comprising forming a conductor on the substrate in electrical communication with the compliant conductive layer.

5. A method for fabricating an interconnect for a semiconductor component having a component contact comprising: providing a substrate; shaping the substrate to form a shaped portion of the substrate comprising a stepped base and a stepped tip on the stepped base; forming an insulating layer on the shaped portion and on the substrate; forming a conductive layer on the insulating layer on the shape portion of the substrate having the stepped base and the stepped tip on the stepped base; and following the forming the conductive layer step, removing the shaped portion of the substrate and the insulating layer on the shaped portion to form a compliant conductive layer configured to electrically contact the component contact, the compliant conductive layer including a base portion on the substrate, a tip portion configured to contact the component contact, and a spring segment portion configured to support the tip portion for movement.

6. The method of claim 5 wherein the substrate comprises a semiconductor material.

7. The method of claim 5 wherein the compliant conductive layer comprises a metal selected from the group consisting of Ti, Cu, Al, W, Mo, Ta, Be, Mg and alloys of these metals.

8. A method for fabricating an interconnect for a semiconductor component having a component contact comprising:
   providing a substrate;
   etching the substrate a first time to form a stepped base;
   etching the substrate a second time to form a stepped tip on the stepped base;
   forming a conductive layer on the stepped base and the stepped tip having an opening configured to permit access to the shaped portion; and
   following the forming the conductive layer step, removing all of the stepped base and all of the stepped tip by etching through the opening to form a compliant conductive layer having a base portion on the substrate, a tip portion configured to electrically engage the component contact, and a spring segment portion configured to support the tip portion for movement.

9. The method of claim 8 wherein the etching the substrate the first time step, and the etching the substrate the second time step, also thin the substrate.

10. The method of claim 8 further comprising forming an insulating layer on the stepped base and the stepped tip, forming the conductive layer on the insulating layer, and removing the insulating layer on the stepped base and the stepped tip during the removing all of the stepped base and all of the stepped tip step.

11. The method of claim 10 wherein the substrate comprises a semiconductor material and the insulating layer comprises a polymer.

12. The method of claim 8 wherein the etching the first time step comprises forming a first mask on the substrate and etching through the first mask, and the etching the second time step comprises forming a second mask on the substrate and etching through the second mask.

13. The method of claim 8 wherein the substrate comprises a semiconductor material, and wherein the etching the substrate the first time step, and the etching the substrate the second time step, both thin the substrate.

14. The method of claim 8 wherein the conductive layer comprises a conductive polymer containing a plurality of particles configured to penetrate the component contact.

15. The method of claim 8 further comprising forming a penetrating structure on the compliant conductive layer configured to penetrate the component contact.

* * * * *

UNITED STATES PATENT AND TRADEMARK OFFICE
CERTIFICATE OF CORRECTION

PATENT NO. : 7,314,821 B2  Page 1 of 1
APPLICATION NO. : 11/030772
DATED : January 1, 2008
INVENTOR(S) : Kirby et al.

It is certified that error appears in the above-identified patent and that said Letters Patent is hereby corrected as shown below:

In column 15, line 1, in Claim 5, delete "shape" and insert -- shaped --, therefor.

Signed and Sealed this

Twenty-ninth Day of April, 2008

JON W. DUDAS
*Director of the United States Patent and Trademark Office*